United States Patent
Zhou (10) Patent No.: US 11,957,004 B2
(45) Date of Patent: Apr. 9, 2024

(54) OLED DISPLAY PANEL AND FABRICATION METHOD THEREOF

(71) Applicant: Shenzhen China Star Optoelectronics Semiconductor Display Technology Co., Ltd., Guangdong (CN)

(72) Inventor: Xingyu Zhou, Guangdong (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 753 days.

(21) Appl. No.: 17/047,076

(22) PCT Filed: Aug. 5, 2020

(86) PCT No.: PCT/CN2020/107032
§ 371 (c)(1),
(2) Date: Oct. 13, 2020

(87) PCT Pub. No.: WO2022/000699
PCT Pub. Date: Jan. 6, 2022

(65) Prior Publication Data
US 2023/0106915 A1  Apr. 6, 2023

(30) Foreign Application Priority Data
Jul. 2, 2020 (CN) .......................... 202010633338.6

(51) Int. Cl.
*H10K 59/124* (2023.01)
*H10K 59/122* (2023.01)
*H10K 71/00* (2023.01)
*H10K 59/12* (2023.01)
*H10K 102/10* (2023.01)

(52) U.S. Cl.
CPC .......... *H10K 59/124* (2023.02); *H10K 59/122* (2023.02); *H10K 71/00* (2023.02); *H10K 59/1201* (2023.02); *H10K 2102/102* (2023.02); *H10K 2102/103* (2023.02)

(58) Field of Classification Search
CPC ..... H10K 59/124; H10K 59/122; H10K 71/00
See application file for complete search history.

(56) References Cited

U.S. PATENT DOCUMENTS 7,187,001 B2 * 3/2007 Kim ..................... H10K 59/131
257/40
11,825,716 B2 * 11/2023 Takahashi ............ H10K 59/124
2015/0102316 A1  4/2015 Park et al.

FOREIGN PATENT DOCUMENTS

CN         1716635      1/2006
CN        102290421    12/2011
(Continued)

*Primary Examiner* — Mark V Prenty (57) ABSTRACT

An OLED display panel and fabrication method thereof are provided by the present application. The OLED display panel includes a substrate, a transparent conductive layer, a buffer layer, a metal oxide semiconductor layer, a gate insulating layer, a gate layer, an interlayer insulating layer, a source-drain layer, and an OLED device layer that are stacked. A light emitting direction of the OLED device layer faces the substrate. In the present application, a conductive electrode and a first electrode plate of a transparent capacitor are both patterned and formed with the transparent conductive layer, and only one process is required. Therefore, a mask is saved and fabrication cost is reduced.

20 Claims, 2 Drawing Sheets

(56) References Cited

FOREIGN PATENT DOCUMENTS

| | | |
|---|---|---|
| CN | 105514116 | 4/2016 |
| CN | 109119440 | 1/2019 |
| CN | 110610964 | 12/2019 |
| CN | 110797384 | 2/2020 |
| CN | 110890408 | 3/2020 |
| CN | 110943112 | 3/2020 |
| CN | 111276527 | 6/2020 |

* cited by examiner

OLED DISPLAY PANEL AND FABRICATION METHOD THEREOF

RELATED APPLICATIONS

This application is a National Phase of PCT Patent Application No. PCT/CN2020/107032 having International filing date of of Aug. 5, 2020, which claims the benefit of priority of Chinese Patent Application No. 202010633338.6 filed on Jul. 2, 2020. The contents of the above applications are all incorporated by reference as if fully set forth herein in their entirety.

FIELD AND BACKGROUND OF THE INVENTION

The present application relates to a field of display technology, and more particularly to an organic light emitting diode (OLED) display panel and a fabrication method thereof.

In existing organic light emitting diode (OLED) display panels having a bottom-emission structure, a metal electrode is usually arranged on a substrate to stabilize a back-channel potential of a thin film transistor. In the meantime, it is also necessary to fabricate a layer of indium tin oxide electrode on the substrate in order to achieve high resolution, and this layer and the metal oxide electrode above a buffer layer form a transparent capacitor. The area where the transparent capacitor is located can also be used as a light-emitting area to increase an aperture ratio. However, the metal electrode and the indium tin oxide electrode of this structure require two processes to complete, so more fabrications are needed which results in an increase in fabrication cost.

Therefore, there is a problem of more fabrications in existing OLED display panels having the bottom-emission structure, which needs to be improved.

SUMMARY OF THE INVENTION

Embodiments of the present application provide an organic light emitting diode (OLED) display panel and a fabrication method thereof to solve technical problems of more fabrications in the existing OLED display panels having the bottom-emission structure.

To solve the above problems, technical solutions provided by the present application are shown as follows:

An embodiment of the present application provides an organic light emitting diode (OLED) display panel, comprising:

a substrate;

a transparent conductive layer formed on a side of the substrate, wherein the transparent conductive layer is patterned to form a conductive electrode and a first electrode plate of a transparent capacitor;

a buffer layer formed on a side of the transparent conductive layer away from the substrate;

a metal oxide semiconductor layer formed on a side of the buffer layer away from the transparent conductive layer, wherein the metal oxide semiconductor layer is patterned to form an active layer of a thin film transistor and a second electrode plate of the transparent capacitor;

a gate insulating layer formed on a side of the active layer away from the buffer layer;

a gate layer formed on a side of the gate insulating layer away from the active layer, wherein the gate layer is patterned to form a gate of the thin film transistor;

an interlayer insulating layer formed on a side of the gate layer away from the gate insulating layer;

a source-drain layer formed on a side of the interlayer insulating layer away from the gate layer, wherein the source-drain layer is patterned to form a source and a drain of the thin film transistor, and the drain is connected to a drain region of the active layer, and the source is connected to a source region of the active layer and the conductive electrode; and an OLED device layer is formed on a side of the source-drain layer away from the interlayer insulating layer, and a light emitting direction of the OLED device layer faces the substrate.

In the OLED display panel of the present application, a material of the transparent conductive layer comprises at least one of indium tin oxide or indium zinc oxide.

In the OLED display panel of the present application, a material of the metal oxide semiconductor layer comprises at least one of indium gallium zinc oxide, indium tin zinc oxide, or indium gallium zinc titanium oxide.

In the OLED display panel of the present application, a projection of the active layer on the substrate is within a projection of the conductive electrode on the substrate.

In the OLED display panel of the present application, the OLED device layer comprises a pixel defining layer and a pixel electrode, the pixel defining layer defines a plurality of light-emitting areas, the pixel electrode is located in the light-emitting areas and is connected to the source of the thin film transistor, and the first electrode plate and the second electrode plate of the transparent capacitor are both disposed corresponding to the light-emitting areas.

In the OLED display panel of the present application, the transparent conductive layer has a thickness of 200 to 2000 angstroms.

In the OLED display panel of the present application, a thickness of the metal oxide semiconductor layer is 100 to 1000 angstroms.

The present application further provides a fabrication method of an organic light emitting diode (OLED) display panel, comprising:

providing a substrate;

sequentially fabricating a transparent conductive layer and a buffer layer on a side of the substrate, wherein the transparent conductive layer is patterned to form a conductive electrode and a first electrode plate of a transparent capacitor;

fabricating a metal oxide semiconductor layer on a side of the buffer layer away from the transparent conductive layer, wherein the metal oxide semiconductor layer is patterned to form an active layer of a thin film transistor and a second electrode plate of the transparent capacitor;

sequentially fabricating a gate insulating layer, a gate layer and an interlayer insulating layer on a side of the active layer away from the buffer layer, wherein the gate layer is patterned to form a gate of the thin film transistor;

forming a source-drain layer on a side of the interlayer insulating layer away from the gate layer, wherein the source-drain layer is patterned to form a source and a drain of the thin film transistor, and the drain is connected to a drain region of the active layer, and the source is connected to a source region of the active layer and the conductive electrode; and forming an OLED device layer on the source-drain layer, and a light emitting direction of the OLED device layer faces the substrate.

In the fabrication method of the OLED display panel of the present application, the step of sequentially fabricating the transparent conductive layer and the buffer layer on the side of the substrate comprises: fabricating the transparent conductive layer on the side of the substrate, wherein a material of the transparent conductive layer comprises at least one of indium tin oxide or indium zinc oxide.

In the fabrication method of the OLED display panel of the present application, the step of fabricating the metal oxide semiconductor layer on the side of the buffer layer away from the transparent conductive layer comprises: fabricating the metal oxide semiconductor layer on the side of the buffer layer away from the transparent conductive layer, and a material of the metal oxide semiconductor layer comprises at least one of indium gallium zinc oxide, indium tin zinc oxide, or indium gallium zinc titanium oxide.

In the fabrication method of the OLED display panel of the present application, the step of fabricating the metal oxide semiconductor layer on the side of the buffer layer away from the transparent conductive layer, wherein the metal oxide semiconductor layer is patterned to form the active layer of the thin film transistor and the second electrode plate of the transparent capacitor comprises: patterning the metal oxide semiconductor layer into the active layer of the thin film transistor and a projection of the active layer on the substrate is within a projection of the conductive electrode on the substrate.

In the fabrication method of the OLED display panel of the present application, the step of forming the OLED device layer on the source-drain layer comprises: fabricating a pixel defining layer and a pixel electrode on a side of the source-drain layer away from the interlayer insulating layer, the pixel defining layer defines a plurality of light-emitting areas, the pixel electrode is located in the light-emitting areas and is connected to the source of the thin film transistor, and the first electrode plate and the second electrode plate of the transparent capacitor are both disposed corresponding to the light-emitting areas.

In the fabrication method of the OLED display panel of the present application, the step of sequentially fabricating the transparent conductive layer and the buffer layer on the side of the substrate comprises: fabricating the transparent conductive layer of a thickness of 200 to 2000 angstroms.

In the fabrication method of the OLED display panel of the present application, the step of fabricating the metal oxide semiconductor layer on the side of the buffer layer away from the transparent conductive layer comprises: fabricating the metal oxide semiconductor layer having a thickness of 100 to 1000 angstroms on a side of the buffer layer away from the transparent conductive layer.

In the fabrication method of the OLED display panel of the present application, after the step of fabricating the OLED device layer on the source-drain layer, further comprises: fabricating an encapsulation layer on a side of the OLED device layer away from the driving circuit.

In the fabrication method of the OLED display panel of the present application, the step of sequentially fabricating the gate insulating layer, the gate layer and the interlayer insulating layer on the side of the active layer away from the buffer layer, wherein the gate layer is patterned to form the gate of the thin film transistor comprises:

patterning the gate layer to form the gate after blanketly depositing the gate insulating layer and the gate layer;

etching the gate insulating layer by using the gate as a self-alignment;

performing a blanket plasma treatment on the pre-process film layers formed by the gate layer, the gate and the metal oxide semiconductor layer; and forming the entire interlayer insulating layer on the side of the gate away from the gate insulating layer.

In the fabrication method of the OLED display panel of the present application, the step of sequentially fabricating the gate insulating layer, the gate layer and the interlayer insulating layer on the side of the active layer away from the buffer layer comprises: fabricating the gate insulating layer on the side of the active layer away from the buffer layer, and a thickness of the gate insulating layer is 1000 to 3000 angstroms.

In the fabrication method of the OLED display panel of the present application, the step of sequentially fabricating the gate insulating layer, the gate layer and the interlayer insulating layer on the side of the active layer away from the buffer layer comprises: fabricating the gate layer on the side of the gate insulating layer away from the active layer, and a material of the gate layer comprises at least one substance or alloy of Mo, Al, Cu, and Ti.

In the fabrication method of the OLED display panel of the present application, the step of fabricating the gate layer on the side of the gate insulating layer away from the active layer comprises: fabricating the gate layer of a thickness of 2000 to 8000 angstroms.

In the fabrication method of the OLED display panel of the present application, the step of fabricating the source-drain layer on the side of the interlayer insulating layer away from the active layer comprises: fabricating the source-drain layer, and a material of the source-drain layer comprises at least one substance or alloy of Mo, Al, Cu, and Ti.

The benefits of the present application are an OLED display panel and a fabrication method thereof are provided by the present application. The OLED display panel comprises a substrate, a transparent conductive layer, a buffer layer, a metal oxide semiconductor layer, a gate insulating layer, a gate layer, an interlayer insulating layer, a source-drain layer, and an OLED device layer. The transparent conductive layer is formed on a side of the substrate and is patterned to form a conductive electrode and a first electrode plate of the transparent capacitor; the buffer layer is formed on a side of the transparent conductive layer away from the substrate; the metal oxide semiconductor layer is formed on a side of the buffer layer away from the transparent conductive layer and is patterned to form an active layer of the thin film transistor and a second electrode plate of the transparent capacitor; the gate insulating layer is formed on a side of the metal oxide semiconductor layer away from the buffer layer; the gate layer is formed on a side of the gate insulating layer away from the metal oxide semiconductor layer and is patterned to form a gate of the thin film transistor; the interlayer insulating layer is formed on a side of the gate layer away from the gate insulating layer; the source-drain layer is formed on a side of the interlayer insulating layer away from the gate layer and is patterned to form a source and drain of the thin film transistor, wherein the drain is connected to a drain region of the active layer, and the source is connected to a source region of the active layer and the conductive electrode; and the OLED device layer is formed on a side of the source-drain layer away from the interlayer insulating layer, and a light emitting direction of the OLED device layer faces the substrate. In the present application, the conductive electrode and the first electrode plate of the transparent capacitor are both patterned and formed with a transparent conductive layer, and only one process is required. Therefore, a mask is saved and fabrication cost is reduced.

BRIEF DESCRIPTION OF THE SEVERAL VIEWS OF THE DRAWINGS

To detailly explain the technical schemes of the embodiments or existing techniques, drawings that are used to illustrate the embodiments or existing techniques are provided. Apparently, the illustrated embodiments are just a part of those of the present disclosure. It is easy for any person having ordinary skill in the art to obtain other drawings without labor for inventiveness.

DESCRIPTION OF SPECIFIC EMBODIMENTS OF THE INVENTION

The description of the following embodiments refers to the attached drawings to illustrate specific embodiments in which the present invention can be implemented. The directional terms mentioned in the present invention, such as up, down, front, back, left, right, inner, outer, side, etc., are for reference only for the direction of the additional schema. Therefore, the directional terms used are used to describe and understand the present invention, rather than to limit the present invention. In the figure, units with similar structures are indicated by the same reference numerals.

Embodiments of the present application provide an organic light emitting diode (OLED) display panel and a fabrication thereof to reduce technical problems of more fabrications needed in existing OLED display panels having a bottom-emission structure.

Figure 1:
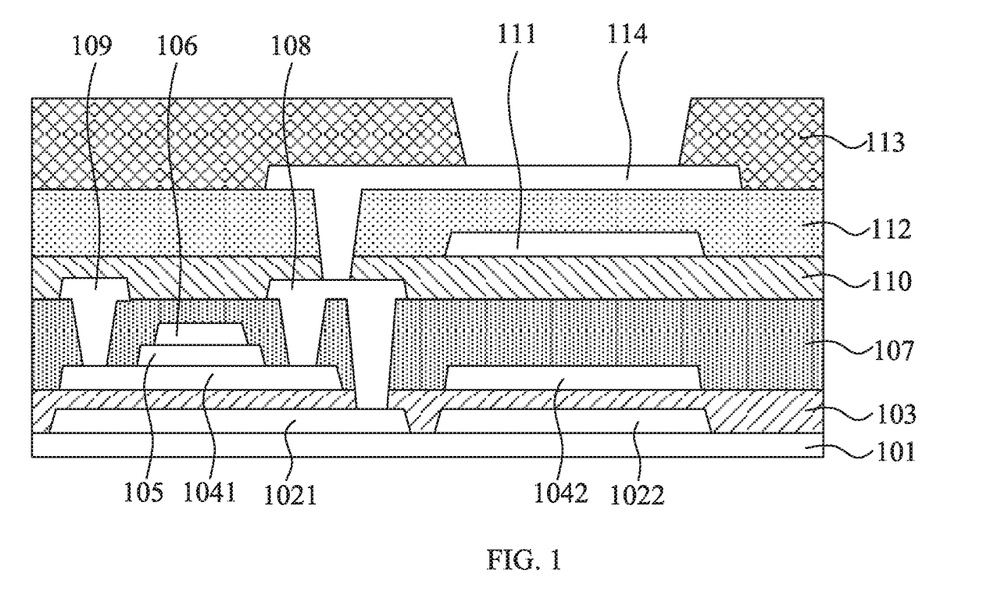
FIG. 1 is a schematic structural diagram of an OLED display panel provided by an embodiment of the present application.

Shown in FIG. 1 is a schematic structural diagram of an organic light emitting diode (OLED) display panel provided by the present application. The OLED display panel comprises a substrate 101, a transparent conductive layer, a buffer layer 103, a metal oxide semiconductor layer, a gate insulating layer 105, a gate layer, an interlayer insulating layer 107, a source-drain layer, and an OLED device layer.

The transparent conductive layer is formed on a side of the substrate 101 and is patterned to form a conductive electrode 1021 and a first electrode plate 1022 of a transparent capacitor.

A buffer layer 103 is formed on a side of the transparent conductive layer away from the substrate 101.

A metal oxide semiconductor layer is formed on a side of the buffer layer 103 away from the transparent conductive layer and is patterned to form an active layer 1041 of a thin film transistor and a second electrode plate 1042 of the transparent capacitor.

A gate insulating layer 105 is formed on a side of the active layer 1041 away from the buffer layer.

A gate layer is formed on a side of the gate insulating layer 105 away from the active layer 1041 and is patterned to form a gate 106 of the thin film transistor.

An interlayer insulating layer 107 is formed on a side of the gate layer away from the gate insulating layer 105.

A source-drain layer is formed on a side of the interlayer insulating layer 107 away from the gate layer and is patterned to form a source 108 and a drain 109 of the thin film transistor. The drain 109 is connected to a drain region of the active layer 1041, and the source 108 is connected to a source region of the active layer.

An OLED device layer is formed on a side of the source-drain layer away from the interlayer insulating layer 107, and a light emitting direction of the OLED device layer faces the substrate 101.

The substrate 101 may be a flexible substrate, and its material may comprise at least one of polyimide, polyethylene terephthalate, polyethylene naphthalate, polycarbonate, polyarylate, or polyethersulfone. It can also be a rigid substrate, for example a glass substrate or other rigid substrates. The type and material of the substrate 101 are not limited by embodiments of the present application.

A material of the transparent conductive layer comprises at least one of indium tin oxide (ITO) or indium zinc oxide (IZO) and has a thickness of 200 to 2000 angstroms. It is patterned by photolithography to form the conductive electrode 1021 and the first electrode plate 1022 of the transparent capacitor.

A material of the buffer layer 103 typically comprises at least one of silicon nitride (SiNx) or silicon oxide (SiOx) and has a thickness of 1000 to 5000 angstroms.

A material of the metal oxide semiconductor layer comprises at least one of indium gallium zinc oxide (IGZO), indium tin zinc oxide (ITZO), or indium gallium zinc titanium oxide (IGZTO) and has a thickness of 100 to 1000 angstroms. It is patterned by photolithography to form the active layer 1041 of the thin film transistor and the second electrode plate 1042 of the transparent capacitor which are not in contact with each other, and they independently communicate signals to perform corresponding operations later on. A projection of the active layer 1041 on the substrate 101 is located within a projection of the conductive electrode 1021 on the substrate 101.

A material of the gate insulating layer 105 usually comprises at least one of silicon nitride (SiNx) or silicon oxide (SiOx), and it may be a single-layer or a multi-layer structure with a thickness of 1000 to 3000 angstroms.

A material of the gate layer may comprise at least one substance or alloy of Mo, Al, Cu, and Ti, and has a thickness of 2000 to 8000 angstroms. The gate 106 is formed by patterning.

When forming the gate insulating layer 105 and the gate 106, the gate insulating layer 105 and the gate layer are first blanketly formed. The gate 106 is then etched out by photolithography and etching, and then the gate 106 is used as a self-alignment for etching the gate insulating layer 105. After etching, there is only the gate insulating layer 105 formed in an area covered by the gate 106, and all the gate insulating layers 105 in other areas are etched away. After the etching is completed, on a side of the gate 106 away from the gate insulating layer 105, the entire surface of the pre-process film layers are subjected to a plasma treatment, which is specifically formed by providing Ar, He, $N_2$, $O_2$, and $NH_3$ and other gases into a tool and letting it be dissociated, and then bombarding the surface of the metal oxide semiconductor layer. After processing, for the active layer 1041, a part of the composition that is not covered by the gate 106 and the gate insulating layer 105 changes and a resistance is significantly reduced, forming the source region and the drain region of the thin film transistor. The part covered by the insulating layer 105 and the gate 106 maintains the semiconductor characteristics and forms a channel region of the thin film transistor. For the second electrode plate 1042 of the transparent capacitor, a resistance thereof is also significantly reduced.

The material of the interlayer insulating layer 107 usually comprises at least one of silicon nitride (SiNx) or silicon oxide (SiOx) and can be a single-layer or a multi-layer structure and has a thickness of 2000 to 10000 angstroms. After blanketly forming the interlayer insulating layer 107, photolithography and etching are performed to form a first via hole, a second via hole, and a third via hole. The first via hole corresponds to the drain region of the active layer 1041, and the second via hole corresponds to the source region of the active layer 1041. The third via hole corresponds to the conductive electrode 1021.

The material of the source-drain layer comprises at least one substance or alloy of Mo, Al, Cu, and Ti, etc., and has a thickness of 2000 to 8000 angstroms. The entire layer is formed and then patterned by photolithography and etching to form the source 108 and the drain 109. The drain 109 is connected to the drain region of the active layer 1041 through the first via hole, and the source electrode 108 is connected to the source region of the active layer 1041 through the second via hole, and is connected to the conductive electrode 1021 through the third via hole.

In addition, the OLED display panel further comprises a passivation layer 110 disposed on the source-drain layer, a color resist layer 111 formed on the passivation layer 110, and a planarization layer 112 formed on the color resist layer 111. A material of the passivation layer usually comprises at least one of silicon nitride (SiNx) or silicon oxide (SiOx) and can be a single-layer or multi-layer structure with a thickness of 1000 to 5000 angstroms. A material of the planarization layer 112 is photoresist with a thickness of 0.5 to 4 μm.

The OLED device layer is formed on the side of the source-drain layer away from the interlayer insulating layer 107, having a light-emission direction facing the substrate 101, and specifically comprises a pixel electrode layer, a pixel defining layer 113, a light emitting material layer, a common electrode, and an encapsulating layer disposed on the planarization layer 112. A material of the pixel electrode layer comprises a stack of ITO/Ag/ITO, and it is patterned to form a plurality of pixel electrodes 114, and the pixel defining layer 113 is disposed between adjacent pixel electrodes 114. A light emitting area is formed between adjacent pixel defining layers 113, and a light-emitting material layer (not shown) is formed in the light-emitting areas, and then a common electrode (not shown) is formed on the light-emitting material layer and the pixel defining layer 113. Finally, the encapsulation layer is formed on the common electrode (not shown). In this embodiment of the present application, the OLED display panel has a bottom-emission structure.

In an OLED display panel, the conductive electrode 1021 is connected to the source electrode 108, and the source electrode 108 is connected to the active layer 1041. During operation, the conductive electrode 1021 is given a fixed low-potential signal, which can make the conductive electrode 1021 provide a stable low potential to the back channel of the active layer 1041 in the thin film transistor so that the back channel potential of the thin film transistor is stable, and the output is stable, which can better drive the OLED device to emit light.

The first electrode plate 1022 and the second electrode plate 1042 of the transparent capacitor are both arranged corresponding to the light-emitting areas, so the area where the transparent capacitor is located can allow light to pass through, having a relative high aperture ratio.

The conductive electrode 1021 in the existing technology is made of an opaque metal material, and the first electrode plate 1022 of the transparent capacitor is made of a transparent conductive material. These two materials are different, so two processes are required to form thereof separately. In the present application, both thereof are formed by patterning a transparent conductive layer, and only one process is required, so a mask is saved, and the cost is reduced without affecting the performance of the device.

Figure 2:
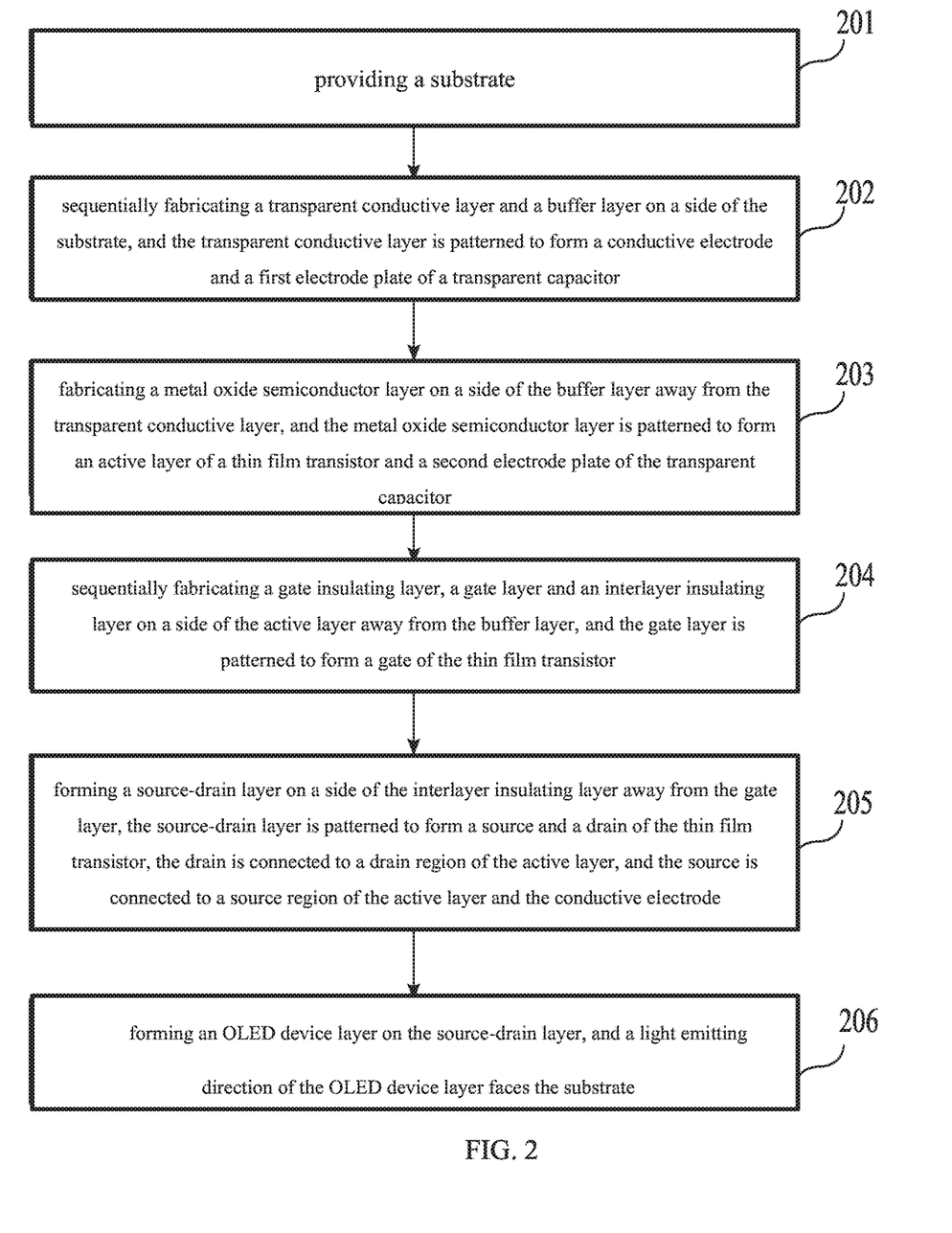
FIG. 2 is a schematic flowchart of a fabrication method of an OLED display panel provided by an embodiment of the present application.

As shown in FIG. 2, the present application also provides a fabrication method of an OLED display panel, comprising following steps:

Step 201: providing a substrate;

Step 202: sequentially fabricating a transparent conductive layer and a buffer layer on a side of the substrate, wherein the transparent conductive layer is patterned to form a conductive electrode and a first electrode plate of a transparent capacitor;

Step 203: fabricating a metal oxide semiconductor layer on a side of the buffer layer away from the transparent conductive layer, wherein the metal oxide semiconductor layer is patterned to form an active layer of a thin film transistor and a second electrode plate of the transparent capacitor;

Step 204: sequentially fabricating a gate insulating layer, a gate layer, and an interlayer insulating layer on a side of the active layer away from the buffer layer, wherein the gate layer is patterned to form a gate of the thin film transistor;

Step 205: forming a source-drain layer on a side of the interlayer insulating layer away from the gate layer, wherein the source-drain layer is patterned to form a source and a drain of the thin film transistor, and the drain is connected to a drain region of the active layer, and the source is connected to a source region of the active layer; and Step 206: forming an OLED device layer on the source-drain layer, and a light emitting direction of the OLED device layer faces the substrate.

The fabrication method will be described in detail below with reference to FIG. 1.

In the step 201, a substrate 101 is provided.

The substrate 101 may be a flexible substrate, and its material may comprise at least one of polyimide, polyethylene terephthalate, polyethylene naphthalate, polycarbonate, polyarylate, or polyethersulfone. It can also be a rigid substrate, specifically a glass substrate or other rigid substrates. The type and the material of the substrate 101 is not limited by embodiments of the present application.

In the step 202, a transparent conductive layer and a buffer layer 103 are sequentially fabricated on a side of the substrate 101, and the transparent conductive layer is patterned to form a conductive electrode 1021 and a first electrode plate 1022 of a transparent capacitor.

A material of the transparent conductive layer comprises at least one of indium tin oxide (ITO) or indium zinc oxide (IZO) and has a thickness of 200 to 2000 angstroms, and it is patterned by photolithography to form the conductive electrodes 1021 and the first electrode plate 1022 of the transparent capacitor In the step 203, a metal oxide semiconductor layer is fabricated on a side of the buffer layer 103 away from the transparent conductive layer, and it is patterned to form the active layer 1041 of the thin film transistor and the second electrode plate 1042 of the transparent capacitor.

A material of the metal oxide semiconductor layer comprises at least one of indium gallium zinc oxide (IGZO), indium tin zinc oxide (ITZO), or indium gallium zinc titanium oxide (IGZTO) and has a thickness of 100 to 1000 angstroms, and it is subjected to photolithography to form the active layer 1041 of the thin film transistor and the second electrode plate 1042 of the transparent capacitor which are not in contact with each other and independently communicate signals to perform corresponding operations later on. A projection of the active layer 1041 on the substrate 101 is located within a projection of the conductive electrode 1021 on the substrate 101.

In the step 204, a gate insulating layer 105, a gate layer, and an interlayer insulating layer 107 are sequentially fabricated on a side of the active layer 1041 away from the buffer layer 103, and the gate layer is patterned to form the gate 106 of the thin film transistor.

A material of the gate insulating layer 105 usually comprises at least one of silicon nitride (SiNx) or silicon oxide (SiOx), and may be a single-layer or multi-layer structure with a thickness of 1000 to 3000 angstroms.

A material of the gate layer may comprise at least one substance or alloy of Mo, Al, Cu, and Ti, and has a thickness of 2000 to 8000 angstroms, and the gate 106 is formed by patterning.

When forming the gate insulating layer 105 and the gate 106, the gate insulating layer 105 and the gate layer are first blanketly formed. The gate 106 is then etched out by photolithography and etching, and then the gate 106 is used as a self-alignment for etching the gate insulating layer 105. After etching, there is only the gate insulating layer 105 formed in an area covered by the gate 106, and all the gate insulating layers 105 in other areas are etched away. After the etching is completed, on a side of the gate 106 away from the gate insulating layer 105, the entire surface of the pre-process film layers are subjected to a plasma treatment, which is specifically formed by providing Ar, He, $N_2$, $O_2$, and $NH_3$, and other gases into a tool and letting it be dissociated, and then bombarding the surface of the metal oxide semiconductor layer. After processing, for the active layer 1041, a part of the composition that is not covered by the gate 106 and the gate insulating layer 105 changes and a resistance is significantly reduced, forming the source region and the drain region of the thin film transistor. The part covered by the insulating layer 105 and the gate 106 maintains the semiconductor characteristics and forms a channel region of the thin film transistor. For the second electrode plate 1042 of the transparent capacitor, a resistance thereof is also significantly reduced.

The material of the interlayer insulating layer 107 usually comprises at least one of silicon nitride (SiNx) or silicon oxide (SiOx) and can be a single-layer or a multi-layer structure and has a thickness of 2000 to 10000 angstroms. After blanketly forming the interlayer insulating layer 107, photolithography and etching are performed to form a first via hole, a second via hole, and a third via hole. The first via hole corresponds to the drain region of the active layer 1041, and the second via hole corresponds to the source region of the active layer 1041. The third via hole corresponds to the conductive electrode 1021.

In the step 205, a source-drain layer is formed on a side of the interlayer insulating layer 107 away from the active layer 1041, wherein the source-drain layer is patterned to form a source 108 and a drain 109 of the thin film transistor, and the drain 109 is connected to a drain region of the active layer 1041, and the source 108 is connected to a source region of the active layer 1042 and the conductive electrode 1021.

The material of the source-drain layer comprises at least one substance or alloy of Mo, Al, Cu, and Ti, etc., and has a thickness of 2000 to 8000 angstroms. The entire layer is formed and then patterned by photolithography and etching to form the source 108 and the drain 109. The drain 109 is connected to the drain region of the active layer 1041 through the first via hole, and the source electrode 108 is connected to the source region of the active layer 1041 through the second via hole, and is connected to the conductive electrode 1021 through the third via hole.

In addition, the OLED display panel further comprises a passivation layer 110 disposed on the source-drain layer, a color resist layer 111 formed on the passivation layer 110, and a planarization layer 112 formed on the color resist layer 111. A material of the passivation layer usually comprises at least one of silicon nitride (SiNx) or silicon oxide (SiOx) and can be a single-layer or multi-layer structure with a thickness of 1000 to 5000 angstroms. A material of the planarization layer 112 is photoresist with a thickness of 0.5 to 4 μm.

In the step 206, an OLED device layer is formed on the source-drain layer, and a light emitting direction of the OLED device layer faces the substrate 101.

The OLED device layer is formed on the side of the source-drain layer away from the interlayer insulating layer 107, having a light-emission direction facing the substrate 101, and specifically comprises a pixel electrode layer, a pixel defining layer 113, a light emitting material layer, a common electrode, and an encapsulating layer disposed on the planarization layer 112. A material of the pixel electrode layer comprises a stack of ITO/Ag/ITO, and it is patterned to form a plurality of pixel electrodes 114, and the pixel defining layer 113 is disposed between adjacent pixel electrodes 114. A light emitting area is formed between adjacent pixel defining layers 113, and a light-emitting material layer (not shown) is formed in the light-emitting areas, and then a common electrode (not shown) is formed on the light-emitting material layer and the pixel defining layer 113. Finally, the encapsulation layer is formed on the common electrode (not shown). In this embodiment of the present application, the OLED display panel has a bottom-emission structure.

In an OLED display panel, the conductive electrode 1021 is connected to the source electrode 108, and the source electrode 108 is connected to the active layer 1041. During operation, the conductive electrode 1021 is given a fixed low-potential signal, which can make the conductive electrode 1021 provide a stable low potential to the back channel of the active layer 1041 in the thin film transistor so that the back channel potential of the thin film transistor is stable, and the output is stable, which can better drive the OLED device to emit light.

The first electrode plate 1022 and the second electrode plate 1042 of the transparent capacitor are both arranged corresponding to the light-emitting areas, so the area where the transparent capacitor is located can allow light to pass through, having a relative high aperture ratio.

The conductive electrode 1021 in the existing technology is made of an opaque metal material, and the first electrode plate 1022 of the transparent capacitor is made of a transparent conductive material. These two materials are different, so two processes are required to form thereof separately. In the present application, both thereof are formed by patterning a transparent conductive layer, and only one process is required, so a mask is saved, and the cost is reduced without affecting the performance of the device.

According to the above embodiments:

The present application provides an OLED display panel and a fabrication method thereof. The OLED display panel comprises a substrate, a transparent conductive layer, a buffer layer, a metal oxide semiconductor layer, a gate insulating layer, a gate layer, an interlayer insulating layer, a source-drain layer, and an OLED device layer. The transparent conductive layer is formed on a side of the substrate and is patterned to form a conductive electrode and a first electrode plate of the transparent capacitor; the buffer layer is formed on a side of the transparent conductive layer away from the substrate; the metal oxide semiconductor layer is formed on a side of the buffer layer away from the transparent conductive layer and is patterned to form an active layer of the thin film transistor and a second electrode plate of the transparent capacitor; the gate insulating layer is formed on a side of the metal oxide semiconductor layer away from the buffer layer; the gate layer is formed on a side of the gate insulating layer away from the metal oxide semiconductor layer and is patterned to form a gate of the thin film transistor; the interlayer insulating layer is formed on a side of the gate layer away from the gate insulating layer; the source-drain layer is formed on a side of the interlayer insulating layer away from the gate layer and is patterned to form the source and drain of the thin film transistor, wherein the drain is connected to the drain region of the active layer, and the source is connected to the source region of the active layer and the conductive electrode; and the OLED device layer is formed on a side of the source-drain layer away from the interlayer insulating layer, and the light emitting direction of the OLED device layer faces the substrate. In the present application, the conductive electrode and the first electrode plate of the transparent capacitor are both patterned and formed with a transparent conductive layer, and only one process is required. Therefore, a mask is saved and the fabrication cost is reduced.

In the above-mentioned embodiments, the description of each embodiment has its own focus. For parts that are not described in detail in an embodiment, reference may be made to related descriptions of other embodiments.

The OLED display panel and the fabrication method thereof provided in the embodiments of the present application are described in detail above. The descriptions of the above embodiments are only used to help understand the technology of the present application, solutions and their core ideas; those of ordinary skill in the art should understand that they can still modify the technical solutions described in the foregoing embodiments or equivalently replace some of the technical features, and these modifications or replacements do not make the essence of the corresponding technical solutions deviate from the scope of the technical solutions of the embodiments of the present application.

What is claimed is:

1. An organic light emitting diode (OLED) display panel, comprising:
    a substrate;
    a transparent conductive layer formed on a side of the substrate, wherein the transparent conductive layer is patterned to form a conductive electrode and a first electrode plate of a transparent capacitor;
    a buffer layer formed on a side of the transparent conductive layer away from the substrate;
    a metal oxide semiconductor layer formed on a side of the buffer layer away from the transparent conductive layer, wherein the metal oxide semiconductor layer is patterned to form an active layer of a thin film transistor and a second electrode plate of the transparent capacitor;
    a gate insulating layer formed on a side of the active layer away from the buffer layer;
    a gate layer formed on a side of the gate insulating layer away from the active layer, wherein the gate layer is patterned to form a gate of the thin film transistor;
    an interlayer insulating layer formed on a side of the gate layer away from the gate insulating layer;
    a source-drain layer formed on a side of the interlayer insulating layer away from the gate layer, wherein the source-drain layer is patterned to form a source and a drain of the thin film transistor, and the drain is connected to a drain region of the active layer, and the source is connected to a source region of the active layer and the conductive electrode; and
    an OLED device layer formed on a side of the source-drain layer away from the interlayer insulating layer, and a light emitting direction of the OLED device layer faces the substrate.

2. The OLED display panel of claim 1, wherein a material of the transparent conductive layer comprises at least one of indium tin oxide or indium zinc oxide.

3. The OLED display panel of claim 1, wherein a material of the metal oxide semiconductor layer comprises at least one of indium gallium zinc oxide, indium tin zinc oxide, or indium gallium zinc titanium oxide.

4. The OLED display panel of claim 1, wherein a projection of the active layer on the substrate is within a projection of the conductive electrode on the substrate.

5. The OLED display panel of claim 1, wherein the OLED device layer comprises a pixel defining layer and a pixel electrode, the pixel defining layer defines a plurality of light-emitting areas, the pixel electrode is located in the light-emitting areas and is connected to the source of the thin film transistor, and the first electrode plate and the second electrode plate of the transparent capacitor are both disposed corresponding to the light-emitting areas.

6. The OLED display panel of claim 1, wherein the transparent conductive layer has a thickness of 200 to 2000 angstroms.

7. The OLED display panel of claim 1, wherein a thickness of the metal oxide semiconductor layer is 100 to 1000 angstroms.

8. A fabrication method of an organic light emitting diode (OLED) display panel, comprising following steps:
    providing a substrate;
    sequentially fabricating a transparent conductive layer and a buffer layer on a side of the substrate, wherein the transparent conductive layer is patterned to form a conductive electrode and a first electrode plate of a transparent capacitor;
    fabricating a metal oxide semiconductor layer on a side of the buffer layer away from the transparent conductive layer, wherein the metal oxide semiconductor layer is patterned to form an active layer of a thin film transistor and a second electrode plate of the transparent capacitor;
    sequentially fabricating a gate insulating layer, a gate layer, and an interlayer insulating layer on a side of the active layer away from the buffer layer, wherein the gate layer is patterned to form a gate of the thin film transistor;
    forming a source-drain layer on a side of the interlayer insulating layer away from the gate layer, wherein the source-drain layer is patterned to form a source and a drain of the thin film transistor, and the drain is connected to a drain region of the active layer, and the source is connected to a source region of the active layer and the conductive electrode; and
    forming an OLED device layer on the source-drain layer, and a light emitting direction of the OLED device layer faces the substrate.

9. The fabrication method of the OLED display panel according to claim 8, wherein the step of sequentially fabricating the transparent conductive layer and the buffer layer on the side of the substrate comprises: fabricating the transparent conductive layer on the side of the substrate, wherein a material of the transparent conductive layer comprises at least one of indium tin oxide or indium zinc oxide.

10. The fabrication method of the OLED display panel according to claim 8, wherein the step of fabricating the metal oxide semiconductor layer on the side of the buffer layer away from the transparent conductive layer comprises: fabricating the metal oxide semiconductor layer on the side of the buffer layer away from the transparent conductive layer, wherein a material of the metal oxide semiconductor layer comprises at least one of indium gallium zinc oxide, indium tin zinc oxide, or indium gallium zinc titanium oxide.

11. The fabrication method of the OLED display panel of claim 8, wherein the step of fabricating the metal oxide semiconductor layer on the side of the buffer layer away from the transparent conductive layer, wherein the metal oxide semiconductor layer is patterned to form the active layer of the thin film transistor and the second electrode plate of the transparent capacitor comprises: patterning the metal oxide semiconductor layer to form the active layer of the thin film transistor, and a projection of the active layer on the substrate is within a projection of the conductive electrode on the substrate.

12. The fabrication method of the OLED display panel according to claim 8, wherein the step of forming the OLED device layer on the source-drain layer comprises: fabricating a pixel defining layer and a pixel electrode on a side of the source-drain layer away from the interlayer insulating layer, wherein the pixel defining layer defines a plurality of light-emitting areas, the pixel electrode is located in the light-emitting areas and is connected to the source of the thin film transistor, and the first electrode plate and the second electrode plate of the transparent capacitor are both disposed corresponding to the light-emitting areas.

13. The fabrication method of the OLED display panel according to claim 8, wherein the step of sequentially fabricating the transparent conductive layer and the buffer layer on the side of the substrate comprises: fabricating the transparent conductive layer having a thickness of 200 to 2000 angstroms.

14. The fabrication method of the OLED display panel according to claim 8, wherein the step of fabricating the metal oxide semiconductor layer on the side of the buffer layer away from the transparent conductive layer comprises: fabricating the metal oxide semiconductor layer having a thickness of 100 to 1000 angstroms on the side of the buffer layer away from the transparent conductive layer.

15. The fabrication method of the OLED display panel according to claim 8, wherein after the step of fabricating the OLED device layer on the source-drain layer, further comprises: fabricating an encapsulation layer on a side of the OLED device layer away from the driving circuit.

16. The fabrication method of the OLED display panel according to claim 8, wherein the step of sequentially fabricating the gate insulating layer, the gate layer, and the interlayer insulating layer on the side of the active layer away from the buffer layer, wherein the gate layer is patterned to form the gate of the thin film transistor comprises:
   patterning the gate layer to form the gate after blanketly depositing the gate insulating layer and the gate layer;
   etching the gate insulating layer by using the gate as a self-alignment;
   performing a blanket plasma treatment on pre-process film layers formed by the gate layer, the gate, and the metal oxide semiconductor layer; and
   forming the entire interlayer insulating layer on the side of the gate away from the gate insulating layer.

17. The fabrication method of the OLED display panel according to claim 8, wherein the step of sequentially fabricating the gate insulating layer, the gate layer, and the interlayer insulating layer on the side of the active layer away from the buffer layer comprises: fabricating the gate insulating layer on the side of the active layer away from the buffer layer, wherein a thickness of the gate insulating layer is 1000 to 3000 angstroms.

18. The fabrication method of the OLED display panel according to claim 17, wherein the step of sequentially fabricating the gate insulating layer, the gate layer, and the interlayer insulating layer on the side of the active layer away from the buffer layer comprises: fabricating the gate layer on the side of the gate insulating layer away from the active layer, wherein a material of the gate layer comprises at least one substance or alloy of Mo, Al, Cu, and Ti.

19. The fabrication method of the OLED display panel according to claim 18, wherein the step of fabricating the gate layer on the side of the gate insulating layer away from the active layer comprises: fabricating the gate layer having a thickness of 2000 to 8000 angstroms.

20. The fabrication method of the OLED display panel according to claim 8, wherein the step of fabricating the source-drain layer on the side of the interlayer insulating layer away from the active layer comprises: fabricating the source-drain layer, wherein a material of the source-drain layer comprises at least one substance or alloy of Mo, Al, Cu, and Ti.

* * * * *